(12) United States Patent
Sakamoto et al.

(10) Patent No.: US 10,593,716 B2
(45) Date of Patent: Mar. 17, 2020

(54) ELECTRONIC COMPONENT AND IMAGING DEVICE COMPRISING AN EXTERNAL DEVICE CONNECTION HAVING A CASE PORTION CONNECTION PORTION AND AN EXTERNAL CONDUCTOR CONNECTION PORTION

(71) Applicant: IRISO ELECTRONICS CO., LTD., Kanagawa (JP)

(72) Inventors: Tetsuma Sakamoto, Kanagawa (JP); Takashi Sekine, Kanagawa (JP); Jyunya Sakaue, Kanagawa (JP)

(73) Assignee: IRISO ELECTRONICS CO., LTD., Kanagawa (JP)

( * ) Notice: Subject to any disclaimer, the term of this patent is extended or adjusted under 35 U.S.C. 154(b) by 248 days.

(21) Appl. No.: 15/825,267

(22) Filed: Nov. 29, 2017

(65) Prior Publication Data

US 2018/0166483 A1 Jun. 14, 2018

(30) Foreign Application Priority Data

Dec. 8, 2016 (JP) .................. 2016-238189

(51) Int. Cl.
*B60R 11/04* (2006.01)
*H01L 27/146* (2006.01)
(Continued)

(52) U.S. Cl.
CPC ..... *H01L 27/14618* (2013.01); *H01R 13/504* (2013.01); *H01R 13/6581* (2013.01);
(Continued)

(58) Field of Classification Search
CPC .... H04N 5/2252; H04N 5/2257; B60R 11/04; H01L 27/14618; H05K 7/2039; H05K 7/20854; H05K 9/0007
(Continued)

(56) References Cited

U.S. PATENT DOCUMENTS 4,453,796 A * 6/1984 Monroe ............... H01R 9/0518
439/581
2014/0118612 A1 5/2014 Koshiba
(Continued)

FOREIGN PATENT DOCUMENTS

CN 205429250 U 8/2016
DE 102014118175 A1 6/2016
(Continued)

OTHER PUBLICATIONS

Extended European Search Report for European Patent App. No. 17204303.6 (dated Feb. 20, 2018).

*Primary Examiner* — Que Tan Le
(74) *Attorney, Agent, or Firm* — Cermak Nakajima & McGowan LLP; Tomoko Nakajima (57) ABSTRACT

To provide an imaging device and an electronic component for the imaging device that are capable of achieving both electromagnetic wave shielding and heat radiation. An external connection connector of a rear housing includes a resin holding portion, and the holding portion includes a case portion connection portion that holds a metal case portion, and a shielding member connection portion that holds a metal shielding member. Accordingly, with a housing including a rear housing, and an imaging device including the housing, heat generated by an electric component can be radiated to the outside effectively with the metal case portion. Furthermore, the metal shielding member can also exert the effect of shielding a pin terminal from electromagnetic waves.

9 Claims, 5 Drawing Sheets

(51) Int. Cl.
   *H01R 13/504* (2006.01)
   *H01R 13/6581* (2011.01)
   *H05K 7/20* (2006.01)
   *H05K 9/00* (2006.01)
   *H01R 13/405* (2006.01)
   *H01R 24/52* (2011.01)

(52) U.S. Cl.
   CPC ....... *H05K 7/2039* (2013.01); *H05K 7/20854* (2013.01); *H05K 9/0007* (2013.01); *H01R 13/405* (2013.01); *H01R 24/52* (2013.01)

(58) Field of Classification Search
   USPC .............................................. 250/239, 208.1
   See application file for complete search history.

(56) References Cited

U.S. PATENT DOCUMENTS

| | | |
|---|---|---|
| 2015/0222795 A1 | 8/2015 | Sauer et al. |
| 2015/0255908 A1 | 9/2015 | Takamura |

FOREIGN PATENT DOCUMENTS

| | | |
|---|---|---|
| EP | 2833489 A2 | 2/2015 |
| JP | 2013-3244 A | 1/2013 |
| JP | 2013-003244 A | 1/2013 |
| JP | 2015-170526 A | 9/2015 |
| WO | WO2016/087227 A1 | 6/2016 |
| WO | WO2016/091770 A1 | 6/2016 |

* cited by examiner

ELECTRONIC COMPONENT AND IMAGING DEVICE COMPRISING AN EXTERNAL DEVICE CONNECTION HAVING A CASE PORTION CONNECTION PORTION AND AN EXTERNAL CONDUCTOR CONNECTION PORTION

BACKGROUND OF THE INVENTION

1. Field of the Invention

The present disclosure relates to an electronic component and, particularly, relates to an electronic component for an imaging device, such as an on-vehicle camera, and an imaging device including the same.

2. Description of the Related Art

An on-vehicle imaging device is used in a drive recorder of a vehicle and to improve visibility behind a vehicle. Such an imaging device includes a substrate on which an image pickup element, such as a CMOS, is mounted and an electronic component, such as a connector. An imaging signal (an electric signal) generated by the image pickup element is output to an external device through a harness connected to the imaging device.

As an example of the external device connection for connecting such a harness, for example, there is a known connector for an electronic apparatus in Japanese Unexamined Patent Application Publication No. 2015-170526 (FIG. 3, connector 30 for electronic apparatus) including a tubular resin connector housing, a tubular metal external conductor held inside the connector housing, a tubular dielectric held inside the external conductor, and a pin-shaped internal conductor that is inserted in the dielectric along an axial direction of the tubular dielectric. According to the above connector, the external conductor disposed outside the dielectric is capable of functioning as an electromagnetic wave shield that protects the internal conductor serving as a transmission path of an imaging signal. Particularly, the connector has a feature in that the connector is suitable for high speed transmission of imaging signals. On the other hand, as signal processing is becoming more advanced in imaging devices, a measure against heat generation of built-in electronic components has become an issue. In other words, in the connector for an electronic device described above, since the connector housing that accommodates the external conductor, the dielectric, and the internal conductor is made of resin, it is difficult to efficiently radiate the heat, which has been generated by the electronic component and which has been accumulated inside the imaging device, to the outside of the connector housing.

One effective measure against such generation of heat of the imaging device is to form the connector housing with metal, such as aluminum that has good thermal conductivity. Japanese Unexamined Patent Application Publication No. 2013-3244 (FIG. 3) discloses an imaging device including a metal housing. It can be conceived that a preferable imaging device configuration that has advantages of both of the above can be obtained by combining the connector for an electronic device in Japanese Unexamined Patent Application Publication No. 2015-170526 (FIG. 3, connector 30 for electronic apparatus) described above that is effective in electromagnetic wave shielding together with the metal housing in Japanese Unexamined Patent Application Publication No. 2013-3244 (FIG. 3) that is effective in radiating heat.

SUMMARY OF THE INVENTION

However, mere combination of the connector for an electronic device in Japanese Unexamined Patent Application Publication No. 2015-170526 (FIG. 3, connector 30 for electronic apparatus) and the metal housing in Japanese Unexamined Patent Application Publication No. 2013-3244 (FIG. 3) is not sufficient. In other words, in the above case, when the external conductor, the dielectric, and the internal conductor in Japanese Unexamined Patent Application Publication No. 2015-170526 (FIG. 3, connector 30 for electronic apparatus) are formed as a built-in connector component, and when the built-in connector component is press-fitted into the metal housing in Japanese Unexamined Patent Application Publication No. 2013-3244 (FIG. 3), a metal external conductor that constitutes an outer periphery of the connector component does not bite into the housing that is also made of metal, making it difficult to obtain sufficient holding force. Accordingly, there is a concern that the connector component may be displaced or fall off from the housing by impact, vibration, or pressing force. Furthermore, since the metal materials are scratched against each other when the connector component is press-fitted into the housing, there is a concern that metal burrs and metal scraps that are the cause of short circuiting may be created.

The present disclosure has been made in the content of the above conventional technique. An object thereof is to provide an electronic component of an imaging device that can achieve both electromagnetic wave shielding and heat radiation. Furthermore, another object is to provide an imaging device that includes such an electronic component.

In order to achieve such objects, the present disclosure is devised with the following configuration.

The present disclosure is an electronic component for an imaging device, the electronic component including a housing that includes a case portion that accommodates a substrate on which a connector is mounted, and an external device connection to which an external device is fitted and connected, and the external device connection including an internal conductor that becomes conductively connected to the external device, and a tubular metal external conductor that accommodates the internal conductor, in which the case portion is made of metal, and the external device connection includes a rigid resin holding portion including a case portion connection portion that holds the case portion, and an external conductor connection portion that holds the external conductor.

According to the present disclosure, the external device connection includes the resin holding portion, and the resin holding portion includes the case portion connection portion that holds the metal case portion, and the external conductor connection portion that holds the metal external conductor. In the present disclosure configured in the above manner, there is no need to press-fit the case portion and the external conductor that are formed of metal materials; accordingly, there is no concern of displacement and falling off happening due to insufficient holding force, and since the metal materials do not scratch against each other, metal burrs and metal scraps that are the cause of short circuiting are not created. Furthermore, the present disclosure is capable of obtaining an electronic component for an imaging device that includes a metal external conductor that is effective in shielding the internal conductor from the electromagnetic wave while the inner heat is effectively radiated to the outside with a metal case portion. Since the case portion that accommodates the substrate is made of metal, not only the electromagnetic wave shielding effect of the external conductor on the internal conductor, but also the electromagnetic wave shielding effect of the case portion can be exerted on the internal conductor. Furthermore, the case portion is capable of exerting a shielding effect that prevents the electromagnetic wave noise of the electronic component disposed between the case portion and the external conductor from leaking out of the imaging device and also, a shielding effect, opposite to the above, that prevents the electromagnetic wave noise from entering the imaging device from the outside towards the inside can be exerted.

The holding portion of the present disclosure may be configured so that the case portion connection portion includes a molded fixing surface with the case portion, and the external conductor connection portion includes a molded fixing surface with the external conductor. With the above, since the holding portion, and the case portion and the external conductor are fixed with the molded fixing surfaces, the holding portion, the case portion, and the external conductor can be firmly formed as an integral structure. In such a case, the holding portion can be configured as a molded body that is integrally structured with the case portion and the external conductor, more specifically, the holding portion can be configured with the case portion and the external conductor as an insert molded body.

The holding portion of the present disclosure may include a fitting portion to which the external device is fitted. With the above, a harness of the external device, for example, can be reliably connected to the fitting portion. In other words, the holding portion can have functions of holding the case portion and the external conductor, and connecting an external device.

The external conductor of the present disclosure may include a fitting chamber at an end portion of the external conductor on a case portion side, the fitting chamber accommodating the connector, and a female terminal conductively contacted to the connector accommodated in the fitting chamber. When conductively connecting the external conductor to the substrate, one may conceive of a method in which a connector is provided in the substrate. In the above case, when the external conductor is configured as a male terminal, and the connector of the substrate is configured as a female connector, a problem arises in that the area occupied by the substrate becomes large compared with a case in which the connector of the substrate is configured as a male connector. Accordingly, in the present disclosure, by having the external conductor include the fitting chamber that accommodates the connector of the substrate, and the female terminal conductively contacted to the accommodated connector, the substrate side is configured as the male connector and the occupied area of the substrate can be reduced.

The female terminal of the present disclosure may include at least one curved contact spring piece that press contacts, from an outer side, a conductive contact portion provided on an outer peripheral surface of the connector. With the above, the contact spring piece can reliably press contact the conductive contact portion provided on the outer peripheral surface of the connector.

In the present disclosure, the female terminal may include a plurality of contact spring pieces, the contact spring pieces being disposed along the outer peripheral surface of the connector. With the above, since the contact spring pieces are disposed along the outer peripheral surface of the connector, elastic deformation of the plurality of contact spring pieces can absorb the displacement of the connector caused by the displacement of the substrate accommodated in the case portion.

The external conductor of the present disclosure may include a protruding end portion that protrudes inside an inner space of the case portion at an end portion of the external conductor on a case portion side. With the above, since the metal external conductor protrudes in the inner space of the metal case portion, while including the resin holding portion in the external device connection of the housing, an area of the internal conductor where the case portion and the external conductor do not overlap each other in the axial direction of the case portion can be eliminated; accordingly, the electromagnetic wave shielding effect can be reliably exerted on the internal conductor.

The holding portion of the present disclosure may be formed of carbon fiber reinforced resin. With the above, the holding portion can also exert an electromagnetic wave shielding effect.

In order to further achieve the object described above, the present disclosure provides an imaging device that includes either one of the above electronic components. With the above, an imaging device may be obtained that includes a metal external conductor that is effective in shielding the internal conductor from the electromagnetic wave while the inner heat is effectively radiated to the outside with a metal case portion. Accordingly, the present disclosure can provide an imaging device that is suitable for high-quality and high-speed transmission of an imaging signal (an electric signal) from an image pickup element.

According to the electronic component and the imaging device of the present disclosure, an imaging device can be provided in which, while the metal case portion effectively radiates the internal heat to the outside, the metal external conductor can eliminate the adverse effect of the electromagnetic wave noise on the internal conductor. Furthermore, the metal case portion and the metal external conductor configured in the above manner can be held reliably with the resin holding portion.

DESCRIPTION OF THE PREFERRED EMBODIMENTS

Figure 1:
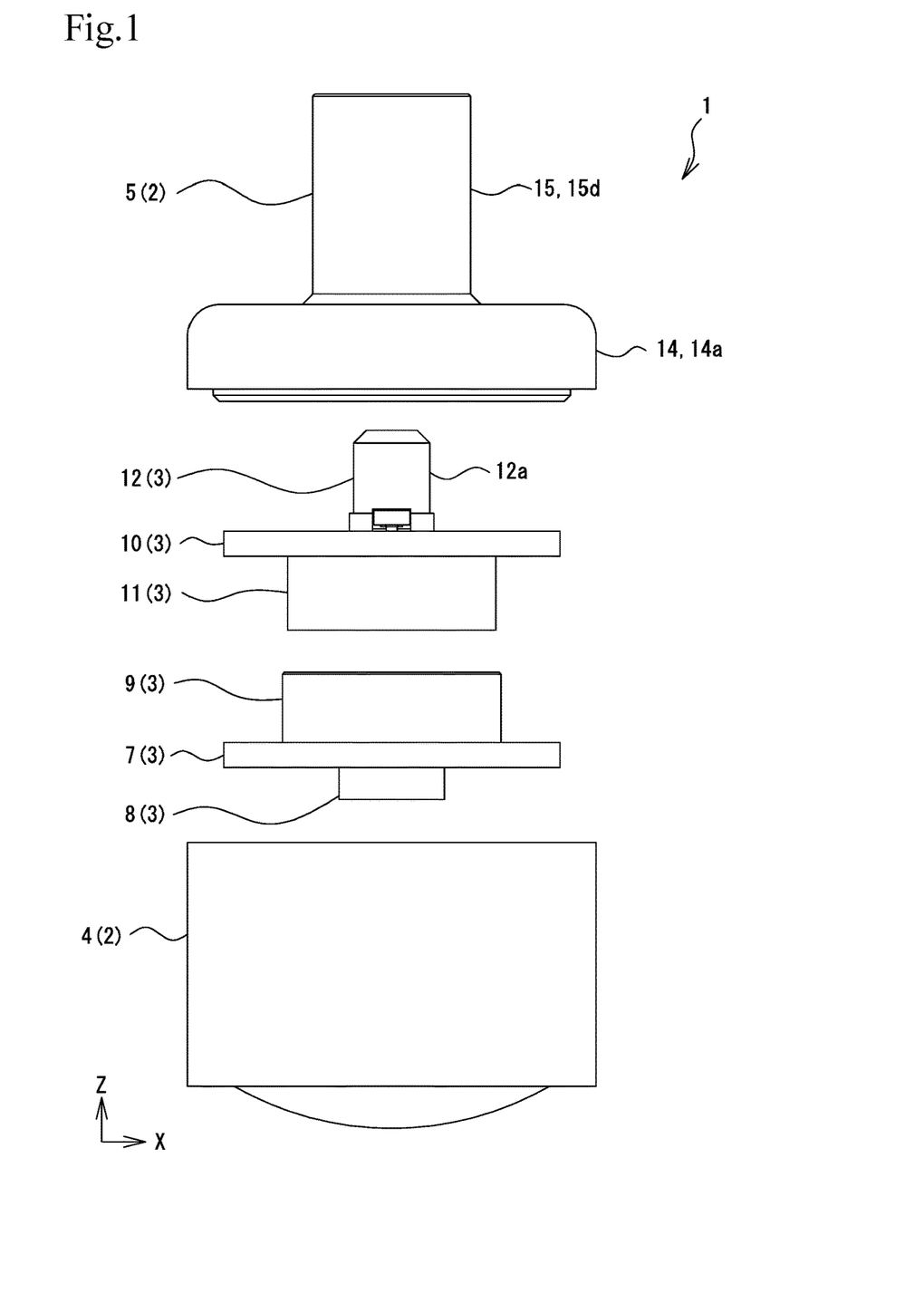
FIG. 1 is an exploded view of an imaging device according to an exemplary embodiment.
Figure 2:
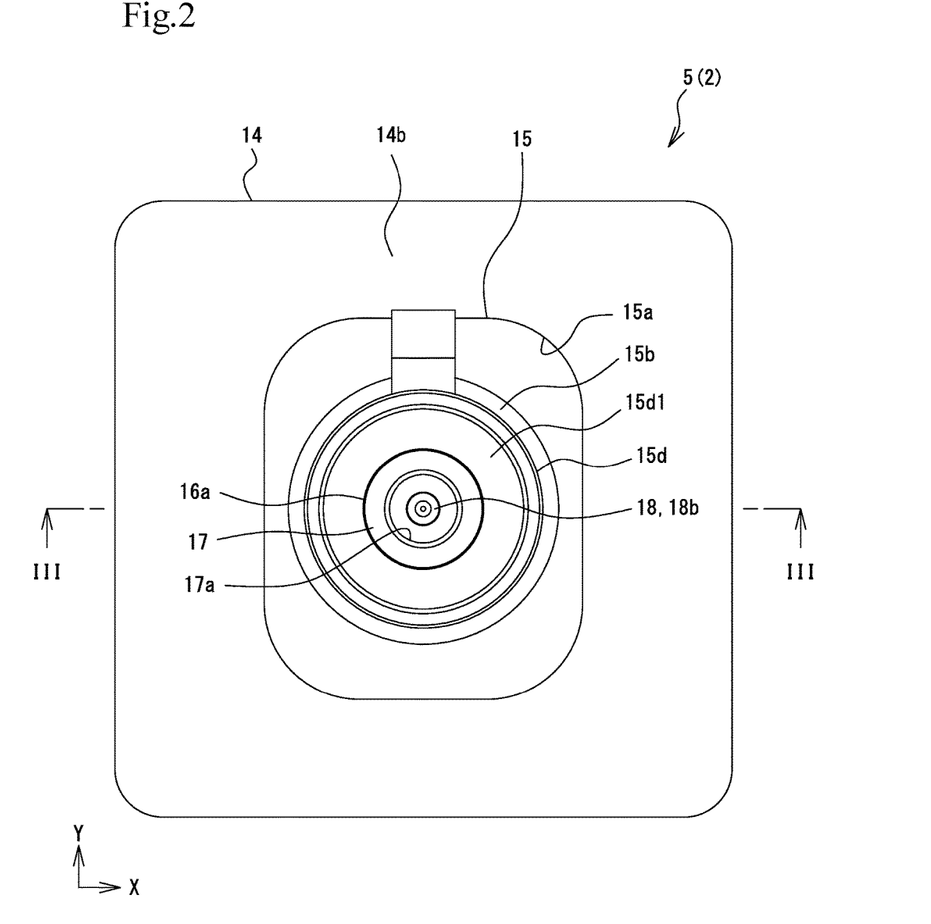
FIG. 2 is a plan vie of the rear housing illustrated in FIG. 1.
Figure 3:
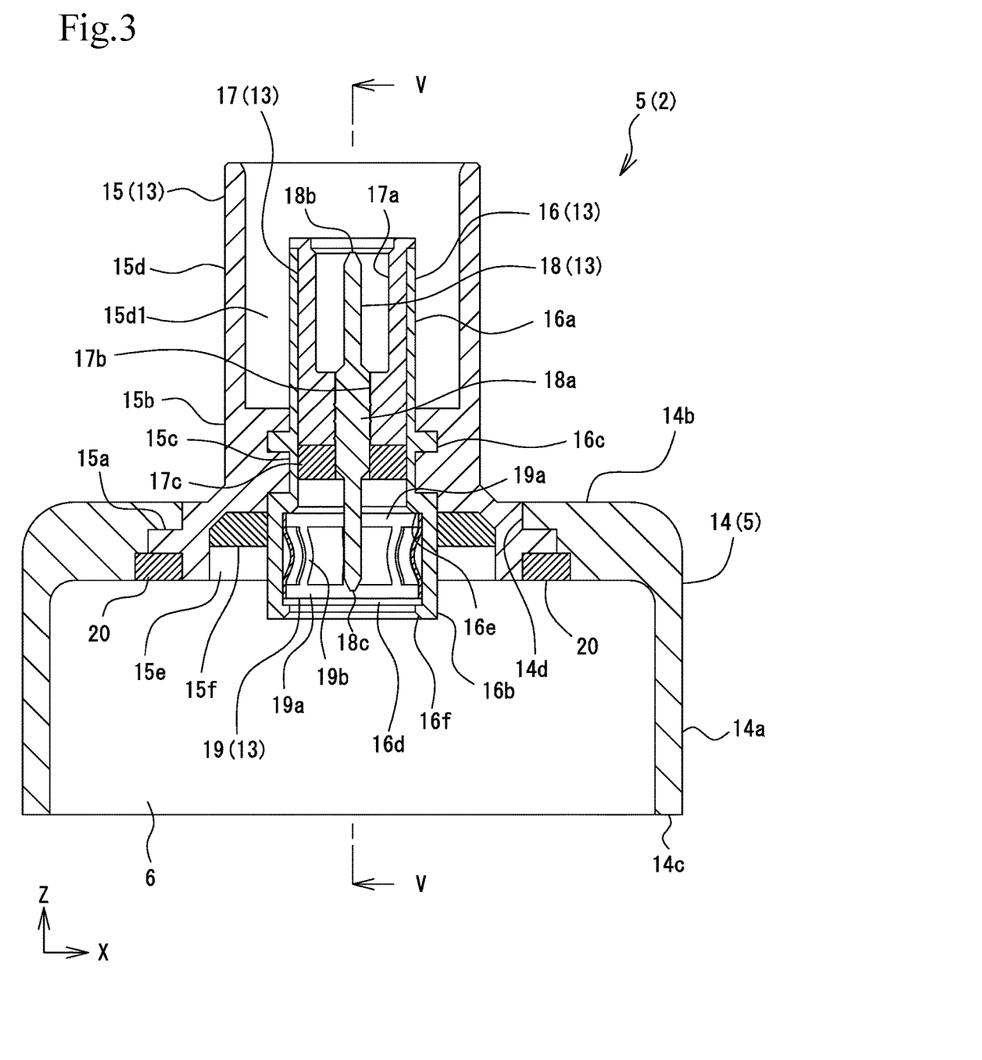
FIG. 3 is a cross-sectional view taken along line III-III in FIG. 2.

Hereinafter, an exemplary embodiment of the present disclosure will be described with reference to the drawings. In the specification, the claims, and the drawings, an X direction illustrated in FIG. 1 is the left-right direction, and a Y direction that is perpendicular to the surface of the sheet is the front-rear direction, and a Z direction is an optical axis direction and the height direction of the imaging device. However, while the left, the right, the front, the rear, up, and down described above are specified, the above directions do not limit the mounting direction and the use direction of the electronic component, the imaging device, and the like of the present disclosure.

As illustrated in an overview in FIG. 1, an imaging device 1 includes a housing 2 formed of a resin molded body made of rigid resin, and an imaging component 3.

The housing 2 includes a front housing 4 and a rear housing 5, and the imaging component 3 is accommodated inside an inner space 6 of the housing 2. The imaging component 3 exemplified in the exemplary embodiment includes an image pickup element 8 and an inter-substrate connecting connector 9 mounted on a first substrate 7, and an inter-substrate connecting connector 11 and a substrate-side connector 12 mounted on a second substrate 10. Circuit wiring of a signal processing system and various elements (not shown) are mounted on the first substrate 7 and the second substrate 10, and the circuit wiring of the signal processing system and the various elements are in conductive communication with each other through the inter-substrate connecting connectors 9 and 11. The substrate-side connector 12 is fitted and connected to an external connection connector 13 serving as an "external device connection" provided in the rear housing 5.

The external connection connector 13 is fitted and connected to a harness component (not shown), and the harness component is connected to an external device. As described above, an imaging signal generated by the imaging component 3 of the imaging device 1 is transmitted to the external device from the external connection connector 13 of the rear housing 5 through the harness component. The features of the imaging device 1 having the outlined configuration described above are the rear housing 5 and the substrate-side connector 12; accordingly, the features thereof will be described in further detail.

Rear Housing 5

The rear housing 5 includes a case portion 14 and the external connection connector 13 described above.

The case portion 14 is made of metal, such as an aluminum alloy, and includes a polygonal tube-shaped tubular peripheral wall 14a and a wall portion 14b formed on one end side of the tubular peripheral wall 14a. The front housing 4 is mounted on an opening edge 14c formed on the other end side of the tubular peripheral wall 14a. A hole-like connection portion 14d connected to the external connection connector 13 is provided in the wall portion 14b.

The external connection connector 13 includes a holding portion 15, a shielding member 16 serving as an "external conductor", a dielectric 17, a pin terminal 18 serving as an "internal conductor", and a female terminal 19.

The holding portion 15 is a molded body formed of carbon fiber reinforced resin, and is formed, by insert molding, as an integrally molded body (an insert molded body) that holds the metal case portion 14 and the metal shielding member 16. The carbon fiber reinforced resin of the holding portion 15 is a resin, such as a thermoplastic resin or a thermosetting resin, in which a conductive carbon fiber is dispersed and blended. Note that a carbon fiber having a surface that has been treated by metal plating may be used, for example. By using such a carbon fiber reinforced resin, the holding portion 15 will have an electromagnetic wave shielding performance; accordingly, the entire rear housing 5 will be capable of exerting an electromagnetic wave shielding effect. Note that a waterproof sealing portion 20 is formed at the boundary between the holding portion 15 and the case portion 14. The sealing portion 20 is formed by filling a waterproof potting material.

A case portion connection portion 15a that holds the connection portion 14d of the case portion 14 described above is formed in the holding portion 15. The case portion connection portion 15a is formed as a molded fixing surface by insert molding and is adhered and firmly fixed to the connection portion 14d. Furthermore, a cylindrical base portion 15b is formed in the holding portion 15. A shielding member connection portion 15c serving as an "external conductor connection portion" that holds the shielding member 16 is formed in the base portion 15b. Similar to the case portion connection portion 15a, the shielding member connection portion 15c is also formed as a molded fixing surface by insert molding and is adhered and firmly fixed to the shielding member 16.

A cylindrical fitting portion 15d is formed on one side of the base portion 15b in the Z direction. A fitting chamber 15d1 to which the harness component (not shown) is fitted and connected by being inserted therein is formed inside the fitting portion 15d. A recess 15e is formed on the other side of the base portion 15b, and a waterproof sealing portion 15f similar to the sealing portion 20 described above is formed inside the recess 15e.

The shielding member 16 is formed of a cylindrical metal material. A tubular portion 16a and a connector portion 16b are formed in the shielding member 16. The shielding member 16 is formed so as to have a length in the Z direction that is longer than a length of the pin terminal 18 so that an electromagnetic wave shielding effect can be exerted across the entire length of the pin terminal 18.

The dielectric 17 is disposed inside the tubular portion 16a. A protrusion 16c that forms a stopper structure with respect to the shielding member connection portion 15c is formed on an outer peripheral surface of the tubular portion 16a, and joining force between the shielding member 16 and the holding portion 15 is enhanced by an increase in the area of the molded fixing surface of the shielding member connection portion 15c and the stopper structure.

The connector portion 16b is formed so as to have a diameter that is larger than that of the tubular portion 16a, and the connector portion 16b is formed so as to be long enough to extend from the base portion 15b through the recess 15e and protrude into the inner space 6 of the rear housing 5. An inner space of the connector portion 16b is a fitting chamber 16d of the substrate-side connector 12. The female terminal 19 is disposed inside the connector portion 16b.

The female terminal 19 is a member conductively connected to the substrate-side connector 12 and includes a pair of annular portions 19a positioned on one side and the other side in the Z direction, and curved contact spring pieces 19b that connect the annular portions 19a. The contact spring pieces 19b are disposed in a plural number so as to be spaced apart in the circumferential direction of the connector portion 16b and the circumferential direction of the annular portions 19a. The contact spring pieces 19b receiving the pressing force of the substrate-side connector 12 inserted therein become elongated such that the curvature thereof is eased, and are displaced in a direction moving the pair of annular portions 19a away from each other. By having the annular portions 19a abut against an enlarged diameter step portion 16e and a stopper lock piece 16f of the connector portion 16b, the displacement of the annular portions 19a are restricted before the curved shapes of the contact spring pieces 19b becomes squashed flat. With the above, the contact spring pieces 19b exert press contact force on the substrate-side connector 12. The female terminal 19 configured in the above manner is stopped from coming off from the connector portion 16b by abutment against the stopper lock piece 16f.

The dielectric 17 is held by being pressed fitted inside the shielding member 16, and holds the shielding member 16 and the pin terminal 18 in an insulated state. A tubular fitting hole 17a is formed in the dielectric 17. A terminal of the harness component (not shown) is inserted into the fitting hole 17a so as to be in conductive contact with the pin terminal 18. An insertion and holding portion 17b of the pin terminal 18 is formed on a lower side of the fitting hole 17a. The pin terminal 18 is held by the insertion and holding portion 17b by being pressed-fitted therein. A waterproof sealing portion 17c similar to the sealing portion 20 described above is formed on the underside of the dielectric 17 so that water content does not pass through a minute gap between the pin terminal 18 and the insertion and holding portion 17b.

The pin terminal 18 is formed of a conductive metal material and is a member that transmits an imaging signal (an electric signal) from the imaging component 3 to the harness component (not shown). The pin terminal 18 is held by the dielectric 17 by press-fitting a base portion 18a into the insertion and holding portion 17b of the dielectric 17. A round and rod-shaped harness-side connection 18b that protrudes in the fitting hole 17a of the dielectric 17 is formed on one end side of the base portion 18a, and a round and rod-shaped connector-side connection 18c that protrudes in the fitting chamber 16d of the connector portion 16b is formed on the other end side of the base portion 18a. The connector-side connection 18c is in conductive communication with the substrate-side connector 12 described next.

Substrate-Side Connector 12

The substrate-side connector 12 includes an outer shell wall 12a serving as a "conductive contact portion", a housing 12b, and a terminal 12c.

The outer shell wall 12a forms an outer peripheral surface of the substrate-side connector 12 and is formed of a cylindrical sheet metal. An opening 12a1 is formed at an upper end of the outer shell wall 12a, and a substrate connected portion 12a2 soldered to the second substrate 10 is formed at the lower end of the outer shell wall 12a. By being in conductive contact with the contact spring pieces 19b of the female terminal 19 of the external connection connector 13 described above, the outer shell wall 12a conductively communicates the second substrate 10 and shielding member 16 to each other.

The housing 12b is formed of a cylindrical resin molded body. The housing 12b is press-fitted inside the outer shell wall 12a and is held therewith. A hole-like fitting chamber 12b1 is formed in the housing 12b along the central axis. A portion of the fitting chamber 12b1 that corresponds to the contact pieces 12c1 of the terminal 12c described later is formed in a tapered shape and forms an inner space that allows outward displacement of the contact pieces 12c1. A terminal holding portion 12b2 that holds a base portion 12c2 of the terminal 12c by press-fitting is provided at a lower end of the fitting chamber 12b1.

The terminal 12c is formed of a conductive metal material and includes the pair of contact pieces 12c1 and the base portion 12c2. The terminal 12c is held by the housing 12b through the base portion 12c2. Each of the contact pieces 12c1 is formed in a cantilevered manner extending from the base portion 12c2. Each of the contact pieces 12c1 includes an elastic arm 12c3 that extends from the base portion 12c2, and a contact portion 12c4 that has a semicircular contact surface that matches an external shape of the round and rod-shaped connector-side connection 18c of the pin terminal 18. Furthermore, substrate connected portions 12c5 that are soldered to the second substrate 10 are formed in the base portion 12c2.

Figure 4:
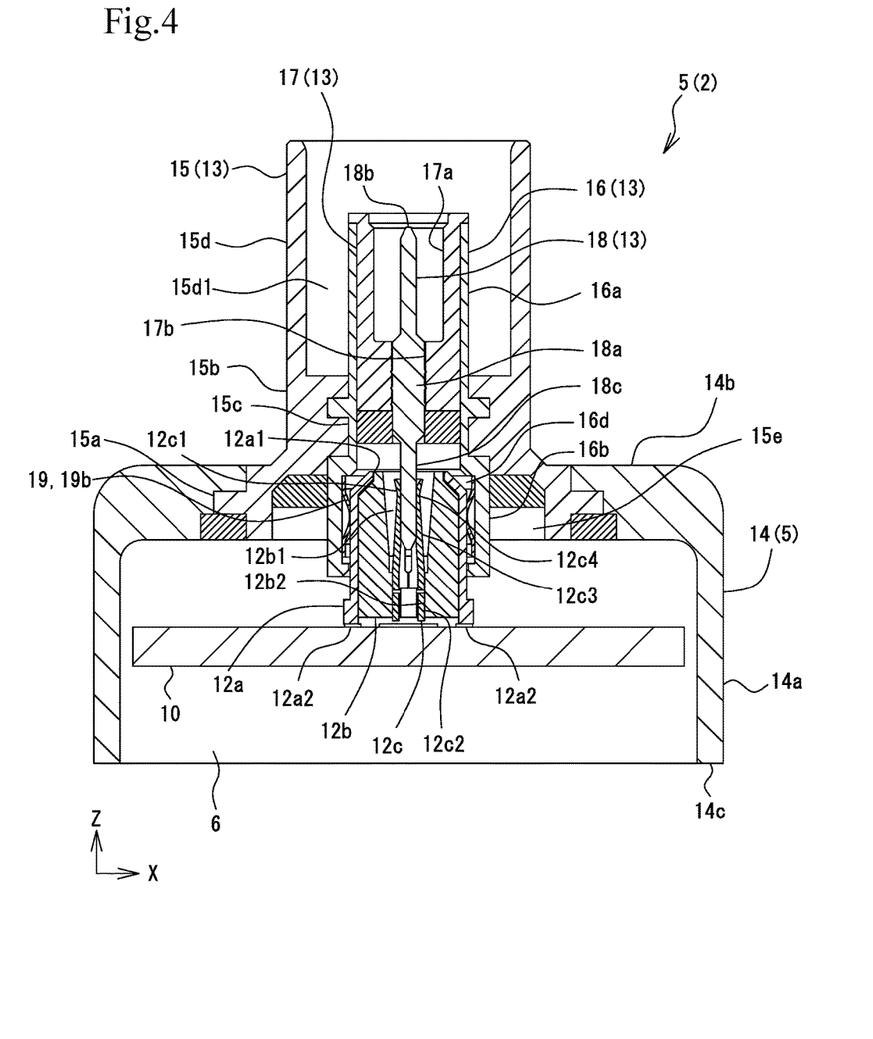
FIG. 4 is a cross-sectional view of the fitted state in FIG. 3.
Figure 5:
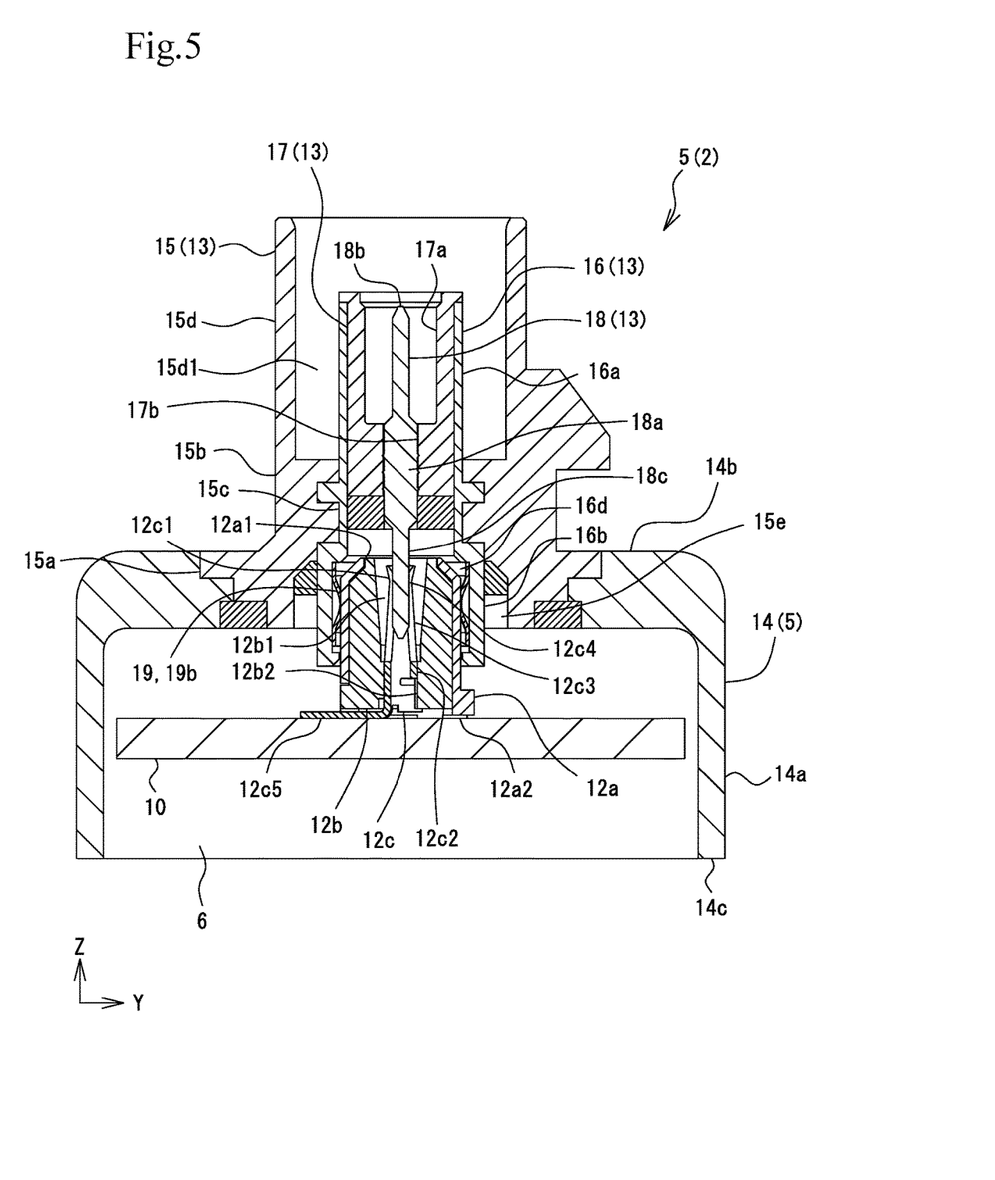
FIG. 5 is a cross-sectional view of the fitted state taken along line V-V in FIG. 3.

As illustrated in FIG. 4, the substrate-side connector 12 having the above-described structure is mounted on the second substrate 10. When assembling the imaging device 1, the substrate-side connector 12 serving as a male connector and the connector portion 16b of the external connection connector 13 serving as a female connector are fitted and connected to each other. When the substrate-side connector 12 is inserted and accommodated inside the fitting chamber 16d of the connector portion 16b, the outer shell wall 12a is conductively contacted to the contact spring pieces 19b of the female terminal 19. With the above, the second substrate 10 is conductively connected to the shielding member 16. Meanwhile, the connector-side connection 18c of the pin terminal 18 is inserted between the pair of contact pieces 12c1 of the terminal 12c of the substrate-side connector 12 and is conductively contacted thereto. With the above, the second substrate 10 is conductively connected to the pin terminal 18. With the fitting and connecting described above, the imaging device 1 is conductively connected to the harness component of the external device (not shown), and the imaging signal of the imaging device 1 is transmitted to an equipment main body of the external device.

Functions and Effects of Exemplary Embodiment

The functions and effects of the imaging device 1 of the present exemplary embodiment except for those that have been described will be described next.

The external connection connector 13 of the rear housing 5 includes a resin holding portion 15, and the resin holding portion 15 includes the case portion connection portion 15a that holds the metal case portion 14, and the shielding member connection portion 15c that holds the metal shielding member 16. Accordingly, the case portion 14 and the shielding member 16 that are metal materials do not have to be press-fitted to each other and, accordingly, there is no concern of displacement and falling off happening that are caused by insufficient holding force due to press-fitting the metal materials to each other. Furthermore, since the metal materials are not scratched against each other by being press-fitted to each other, there is no concern of metal burrs and metal scraps, which are the cause of short circuiting, being created. Accordingly, with the housing 2 including the rear housing 5, and the imaging device 1 including the housing 2, the heat generated by an electric component 3 can be radiated to the outside effectively with the metal case portion 14. Furthermore, the metal shielding member 16 can also exert the effect of shielding the pin terminal 18 from electromagnetic waves. Accordingly, the imaging device 1 that is suitable for high-quality and high-speed transmission of an image signal (an electric signal) from the imaging component 3 can be obtained.

Furthermore, the holding portion 15 is formed as a resin molded body in which the case portion 14 and the shielding member 16 are inserted, and the case portion 14, the shielding member 16, and the holding portion 15 are configured as an integrally structured molded body manufactured through a relatively easy method. For example, one may conceive of providing the metal case portion 14 and shielding member 16 by metal die-casting; however, it is highly difficult to form the thin shielding member 16 by metal die-casting and the yield is low. In the present exemplary embodiment, the integrally structured holding portion 15 can be manufactured through a relatively easy method of insert molding.

Since the holding portion 15 is not a metal member but is a resin molded body, shape of the fitting portion 15*d* is relatively flexible. Accordingly, there is an advantage in that the fitting portion 15*d* can be formed according to the fitting shape of the harness component of the external device (not shown).

The shielding member 16 includes the fitting chamber 16*d* that accommodates the substrate-side connector 12, and the fitting chamber 16*d* includes the female terminal 19 conductively contacted to the outer shell wall 12*a* of the substrate-side connector 12. When conductively connecting the shielding member 16 to the second substrate 10, one may conceive of a method in which a connector is provided in the second substrate 10. Furthermore, in the above case, when the shielding member 16 is configured as a male terminal, and the connector provided in the second substrate 10 is configured as a female connector, the area occupied by the second substrate 10 becomes large compared with a case in which the connector of the second substrate 10 is configured as a male connector, such as the substrate-side connector 12. Conversely, in the present exemplary embodiment, the connector portion 16*b* of the shielding member 16 is configured as a female connector including the female terminal 19, and the substrate-side connector 12 of the second substrate 10 is configured as a male connector; accordingly, the surface occupied by the second substrate 10 can be smaller.

In the female terminal 19, the plurality of contact spring pieces 19*b* are disposed in the circumferential direction of the connector portion 16*b*. Accordingly, even if a displacement occurs when the second substrate 10 is installed in the inner space 6 of the rear housing 5, the displacement of the substrate-side connector 12 can be absorbed by the elastic deformation of the plurality of contact spring pieces 19*b* while in a state in which the substrate-side connector 12 is fitted in the fitting chamber 16*d*.

The connector portion 16*b* is formed so as to have a length, from the base portion 15*b*, that protrudes inside the inner space 6 of the rear housing 5 through the recess 15*e*. In other words, the connector portion 16*b* is a "protruding end portion" of the present disclosure. Since the metal connector portion 16*b* protrudes in the inner space 6 of the metal case portion 14 in the above manner, while including the resin holding portion 15 in the rear housing 5, an area of the pin terminal 18 where the case portion 14 and the shielding member 16 do not overlap each other in the axial direction (the Z direction) of the case portion 14 can be eliminated; accordingly, the electromagnetic wave shielding effect can be reliably exerted on the pin terminal 18.

Modifications of Exemplary Embodiment

Regarding the exemplary embodiment, various modifications can be enabled; accordingly, examples thereof will be described.

In the exemplary embodiment described above, while an example including a single piece of pin terminal 18 has been given, there may be two or more pin terminals 18. In such a case, the external connection connector 13 needs to be modified in accordance with the number of pin terminals 18.

In the exemplary embodiment described above, an example of an insert molded body in which the case portion 14 and the shielding member 16 are inserted in the holding portion 15 has been given; however, the case portion 14 and the shielding member 16 may be connected to the holding portion 15 with an adhesive layer formed by an adhesive agent or the like. Furthermore, for example, a molded fixing surface formed by insert molding and an adhesive layer formed by an adhesive agent or the like may be combined such that the holding portion 15 and the shielding member 16 are insert molded and the holding portion 15 and the case portion 14 are adhered with an adhesive agent.

In the exemplary embodiment described above, an example in which the holding portion 15 is formed of a molded body made of carbon fiber reinforced resin has been given; however, the holding portion 15 may be formed as a molded body made of thermoplastic resin or thermosetting resin in which no carbon fiber is blended.

In the exemplary embodiment described above, an exemplary configuration has been given in which the outer shell wall 12*a* is formed in a tubular manner so that the positioning between the substrate-side connector 12 and the contact spring pieces 19*b* in the circumferential direction is not required; however, the outer shell wall 12*a* may have a divided shape so as to correspond to each of the contact spring pieces 19*b*.

What is claimed is:

1. An electronic component for an imaging device, the electronic component comprising:
    a housing that includes
        a case portion that accommodates a substrate on which a connector is mounted, and
        an external device connection to which an external device is fitted and connected; and
    the external device connection including
        an internal conductor that becomes conductively connected to the external device, and
        a tubular metal external conductor that accommodates the internal conductor,
    wherein the case portion is made of metal, and
    wherein the external device connection includes a rigid resin holding portion including a case portion connection portion that holds the case portion, and an external conductor connection portion that holds the external conductor.

2. The electronic component according to claim 1, wherein the holding portion includes a fitting portion to which the external device is fitted.

3. The electronic component according to claim 1, wherein the external conductor includes
    a fitting chamber at an end portion of the external conductor on a case portion side, the fitting chamber accommodating the connector, and
    a female terminal conductively contacted to the connector accommodated in the fitting chamber.

4. The electronic component according to claim 3, wherein the female terminal includes at least one curved contact spring piece that press contacts, from an outer side, a conductive contact portion provided on an outer peripheral surface of the connector.

5. The electronic component according to claim 4, wherein the female terminal includes a plurality of the contact spring pieces, the contact spring pieces being disposed along the outer peripheral surface of the connector.

6. The electronic component according to claim 1, wherein the external conductor includes a protruding end portion that protrudes inside an inner space of the case portion at an end portion of the external conductor on a case portion side.

7. The electronic component according to claim 1, wherein the holding portion is formed of carbon fiber reinforced resin.

8. The electronic component according to claim 1, wherein the holding portion includes one molded fixing surface that is firmly fixed to the case portion, and the other molded fixing surface that is firmly fixed to the external conductor, the holding portion being integrally structured with the case portion and the external conductors as an insert molded body.

9. An imaging device comprising:
the electronic component according to claim 1.

* * * * *